US005631196A

United States Patent [19]

Kane et al.

[11] Patent Number: 5,631,196

[45] Date of Patent: May 20, 1997

[54] METHOD FOR MAKING INVERSION MODE DIAMOND ELECTRON SOURCE

[75] Inventors: Robert C. Kane, Scottsdale; Xiaodong T. Zhu, Chandler, both of Ariz.

[73] Assignee: Motorola, Schaumburg, Ill.

[21] Appl. No.: 385,027

[22] Filed: Feb. 7, 1995

Related U.S. Application Data

[62] Division of Ser. No. 276,879, Jul. 18, 1994, Pat. No. 5,430,348.

[51] Int. Cl.$^6$ .......... H01L 21/465

[52] U.S. Cl. .......... 438/20; 313/309; 313/311; 313/336; 313/351; 315/169.4; 345/75; 257/10; 438/105

[58] Field of Search .......... 437/228; 313/308, 313/309, 311, 336, 351; 315/169.4; 345/75; 257/10, 11, 12, 102

[56] References Cited

U.S. PATENT DOCUMENTS

| | | | |
|---|---|---|---|
| 4,498,952 | 2/1985 | Christensen | 156/643 |
| 5,138,237 | 8/1992 | Kane et al. | 315/349 |
| 5,141,460 | 8/1992 | Jaskie et al. | 445/24 |
| 5,191,217 | 3/1993 | Kane et al. | 250/423 |
| 5,258,685 | 11/1993 | Jaskie et al. | 313/309 |
| 5,289,086 | 2/1994 | Kane | 315/349 |

OTHER PUBLICATIONS

Geis et al, "Diamond Cold Cathode", IEEE Elec. Dev. Lett., vol. 12, No. 8, Aug. 1991.

*Primary Examiner*—John Niebling
*Assistant Examiner*—Long Pham
*Attorney, Agent, or Firm*—Eugene A. Parsons

[57] ABSTRACT

An electron source including selectively impurity doped semiconductor diamond wherein regions of selectively impurity doped regions are inverted with respect to the charge carrier population to provide a conductive path traversed by electrons subsequently emitted into a free-space region from the electron emitter. An inversion mode electron emission device including a selectively impurity doped semiconductor diamond electron emitter, for emitting electrons; a control electrode; and an anode for collecting emitted electrons wherein operation of the device relies on the inducement of an inversion region to facilitate electron transit to an electron emitting surface of the electron emitter.

9 Claims, 4 Drawing Sheets

METHOD FOR MAKING INVERSION MODE DIAMOND ELECTRON SOURCE

This is a division of application Ser. No. 08/276,879, filed Jul. 18, 1994 now U.S. Pat. No. 5,430,348.

FIELD OF THE INVENTION

This invention relates, in general, to electron sources and, more particularly, to semiconductor diamond material electron emitters.

BACKGROUND OF THE INVENTION

Non-thermionic electron sources are known in the art and are commonly employed as electron sources wherein electrons are accelerated from an electron emitting surface into an adjacent free space region. In practice, electron emission is realized by providing very high electric fields on the order of $3\times10^7$ Volts per centimeter (V/cm) at a surface of the electron emitter material. Such high electric fields typically are realized by providing electron emitter structures having a geometric discontinuity of a small radius of curvature as a method of enhancing the electric field strength.

Alternatively, electron sources or emitters are made of materials or surface coatings exhibiting a low surface work function (less than approximately 4 electron volts) in order to achieve appreciable electron emission with a reduction in the requirement of electric field enhancement.

Field emission electron sources of the prior art are typically controlled by modulating a voltage which is employed to provide the electron emission inducing electric field at the electron emitter.

Surface area electron emitters, such as diamond material electron emitters, have recently been introduced which provide appreciable electron emission at electric fields on the order of approximately $50\times10^3$ V/cm.

An operational detriment of this new type of electron emitter is that desirable control of the electron emission inducing electric field is not practical for most applications.

Accordingly, there exists a need for an electron emitter which overcomes at least some of the shortcomings of the prior art.

SUMMARY OF THE INVENTION

This need and others are met through provision of an inversion mode electron emitter including a selectively impurity doped diamond semiconductor electron emitter having an emitting surface, for emitting electrons, a major surface, a control electrode disposed substantially peripherally about a part of the major surface in a manner which provides for an insulating region between the major surface and the control electrode.

These needs are further met through provision of an inversion mode electron emission device including a selectively impurity doped diamond semiconductor electron emitter having an emitting surface, for emitting electrons, a major surface, and a control electrode disposed substantially peripherally about a part of the major surface in a manner which provides for an insulating region between the major surface and the control electrode; and an anode, for collecting some emitted electrons, distally disposed with respect to the emitting surface. Application of an externally provided voltage of proper magnitude and polarity between the control electrode and the selectively impurity doped diamond semiconductor electron emitter induces an electron conducting inversion layer in the electron emitter substantially at the major surface.

In one embodiment of the inversion mode electron emitter described herein, an electrically conductive inversion layer is provided in the selectively impurity doped semiconductor diamond electron emitter by application of an externally provided voltage to a control electrode.

In another embodiment of the inversion mode electron emitter, the inversion layer is realized by providing external voltages to a plurality of control electrodes each of which is disposed peripherally about a part of the major surface of the selectively impurity doped semiconductor diamond electron emitter.

In an embodiment of an inversion mode electron emission device, an anode is provided to collect some of any electrons emitted from the emitting surface of the electron emitter.

DETAILED DESCRIPTION OF THE DRAWINGS

Figure 1:
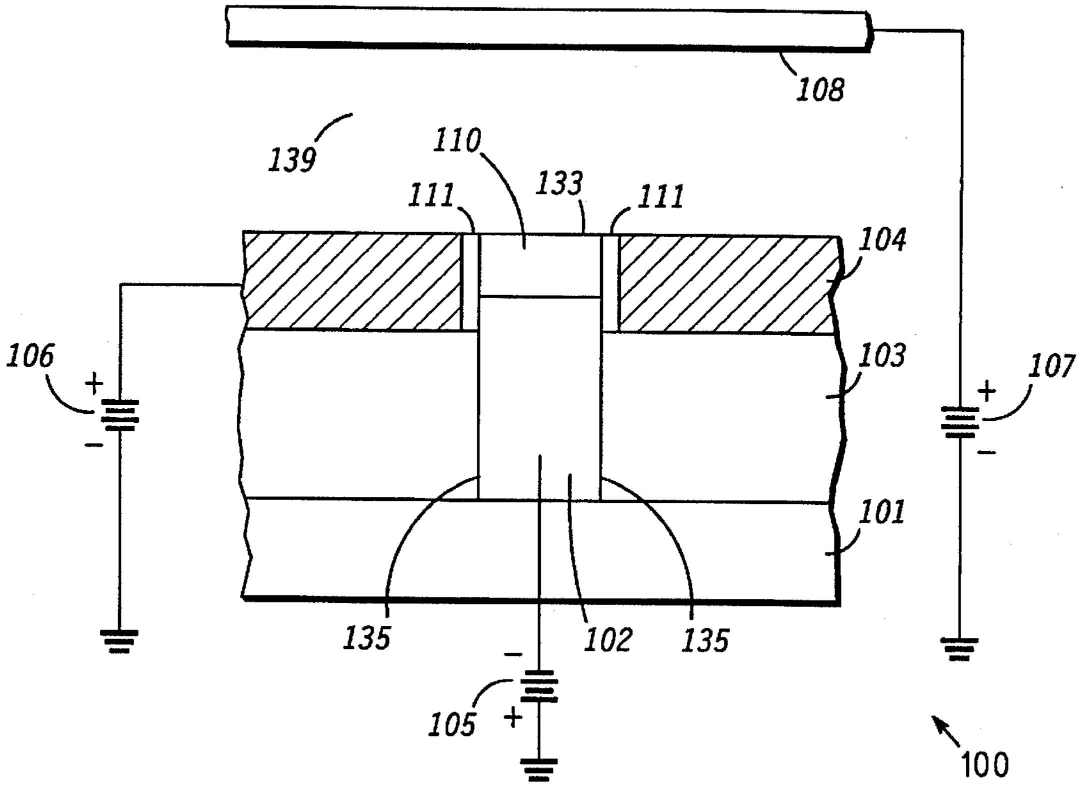
FIGS. 1 and 2 are cross-sectional views illustrating embodiments of a semiconductor diamond electron emission device made in accordance with the present invention.

FIG. 1 shows a cross-sectional view illustrating an embodiment of an inversion mode electron emission device 100 made in accordance with the present invention. A supporting substrate 101 having a surface is provided whereon a selectively impurity doped semiconductor diamond electron emitter (inversion mode electron emitter) 102, having an electron emitting surface 133, for emitting electrons, and a major surface 135, is disposed. A first insulator 103 is disposed on the surface of supporting substrate 101 and proximal to a part of major surface 135 of electron emitter 102. A control electrode 104 is disposed on insulator 103 and substantially peripherally about a part of major surface 135 of electron emitter 102 in a manner which provides for an insulating region 111 between major surface 135 and control electrode 104. In various realizations of device 100, insulative region 111 is realized by conformal deposition of a layer of insulator material which may also include a part of insulator 103. In such instances, insulator 103 may be made of a plurality of insulator layers. Alternatively, the insulative region is realized as a gap between the material which includes control electrode 104 and the material which comprises electron emitter 102.

FIG. 1 further illustrates an anode 108, for collecting emitted electrons, distally disposed with respect to emitting surface 133 and defining a free-space region 139 therebetween.

Inversion mode electron emission device 100 is depicted as provided with external voltage sources 105, 106 and 107 which may be employed during device operation. A first externally provided voltage source 106 is operably coupled between control electrode 104 and a reference potential. A second externally provided voltage source 105 is operably connected between electron emitter 102 and the reference potential. Generally, second externally provided voltage source 105 may be replaced by operating device 100 with electron emitter 102 connected to the reference potential which is equivalent to providing second externally provided voltage source 105 with a voltage of zero volts. Third externally provided voltage source 107 is operably connected between anode 108 and the reference potential. Inversion mode electron emitter 102 may, in some applications, function as an electron source without the need to provide an anode.

A depletion region or a selectively impurity doped portion 110 of electron emitter 102 impedes the flow of electrons to emitting surface 133.

Figure 2:
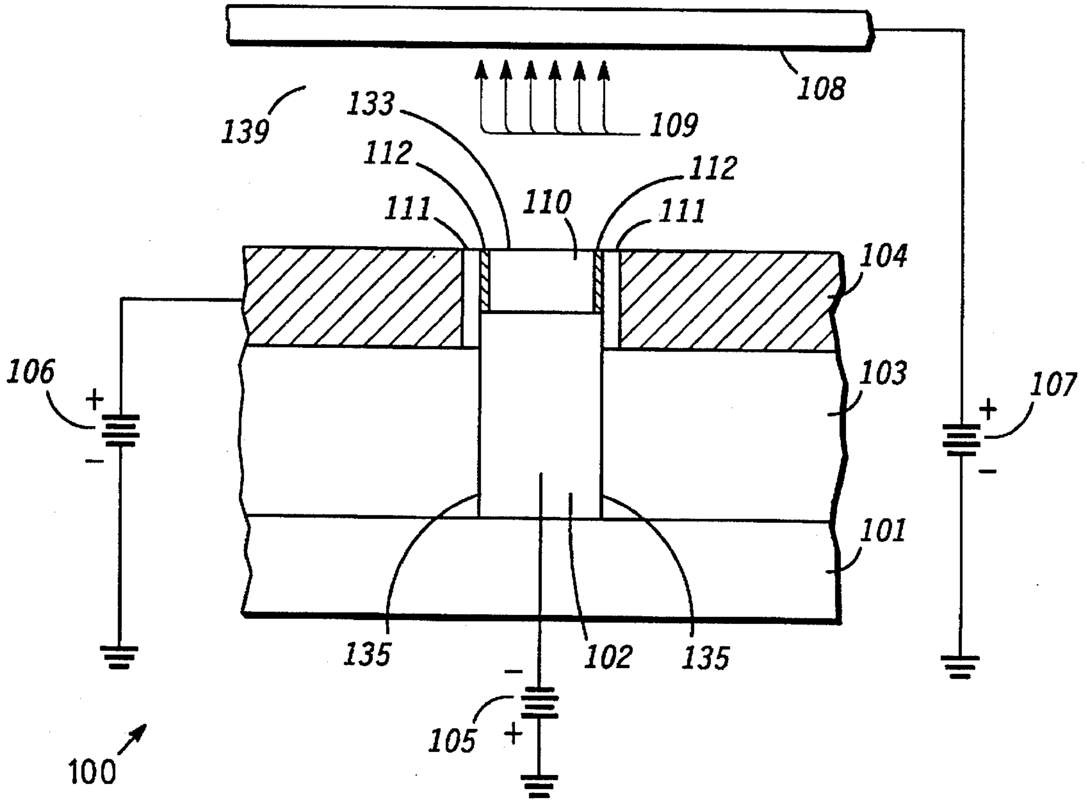

FIG. 2 is a cross-sectional view illustrating a modification of the inversion mode electron emission device 100 as described with reference to FIG. 1 which further illustrates an electron conducting inversion layer 112. Inversion layer 112 is realized by providing a voltage via first externally provided voltage source 106 such that the depletion of majority charge carriers at the area of the depletion region nearest control electrode 104 is so extensive that minority charge carriers become dominant. Under such a condition, a population of charge carriers is said to be inverted. Hence, the terminology "inversion mode". For example, in order for the selective impurity doping to serve to impede the flow of electrons to emitting surface 133, impurity doped portion 110 is p-doped. P-doping is achieved by incorporating an impurity material such as boron into semiconductor diamond electron emitter 102 which results in a deficiency of conduction band electrons in selectively impurity doped portion 110 of electron emitter 102. Having restricted our immediate consideration of impurity doping to selectively impurity doped region 110, no restriction has been placed on the impurity concentration in the remainder of electron emitter 102. Part of the electron emitter not selectively impurity doped, region 110, may be either intrinsic material or impurity doped material. Additionally, as will be described subsequently, the selective impurity doping may form a plurality of regions.

Inversion layer 112 provides a suitable conduction path which electrons traverse to arrive at emitting surface 133. Electrons at emitting surface 133 are accelerated into free-space region 139 adjacent to emitting surface 133 by means of an induced electric field such as that which is provided by applying a voltage to anode 108. Emitted electrons, represented by arrows 109, traverse free-space region 139 to be collected at anode 108. Alternatively, in the absence of an anode or externally provided anode voltage, electrons arriving at emitting surface 133 of electron emitter 102 are accelerated into free-space region 139 by an electric field induced by the voltage applied to control electrode 104 in which case emitted electrons, represented by arrows 109, are substantially collected at control electrode 104.

Figure 3:
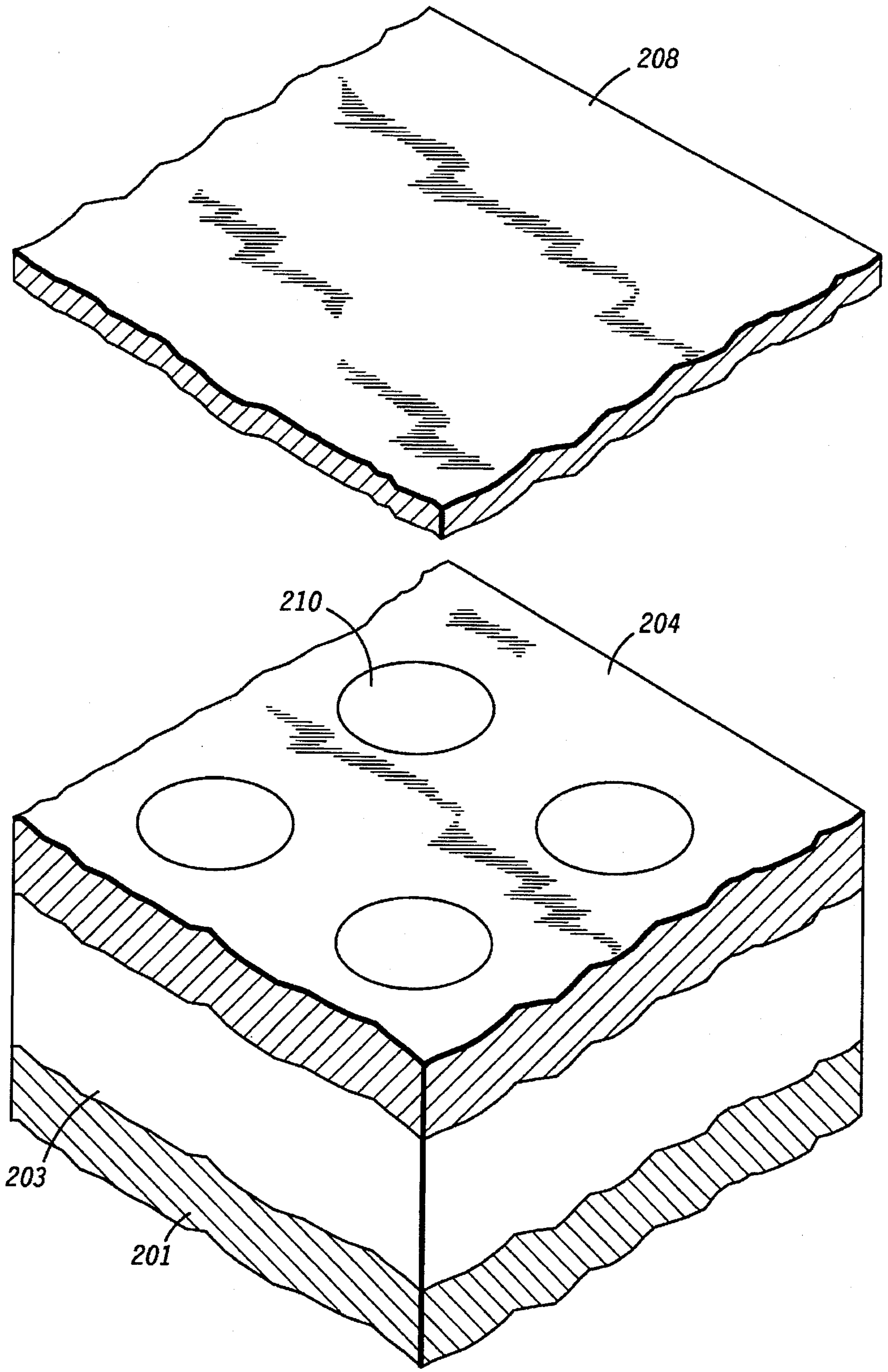
FIG. 3 is a perspective view of another embodiment of a semiconductor diamond electron emission device made in accordance with the present invention.

FIG. 3 is a partial perspective view of another embodiment of an inversion mode electron emission device of the present invention wherein features corresponding to those previously described with reference to FIGS. 1 and 2 are similarly referenced beginning with the numeral "2". Additionally, FIG. 3 illustrates a plurality of electron emitters incorporated into an electron emission device to provide an array of electron sources which are selectively energized as described previously.

Figure 4:
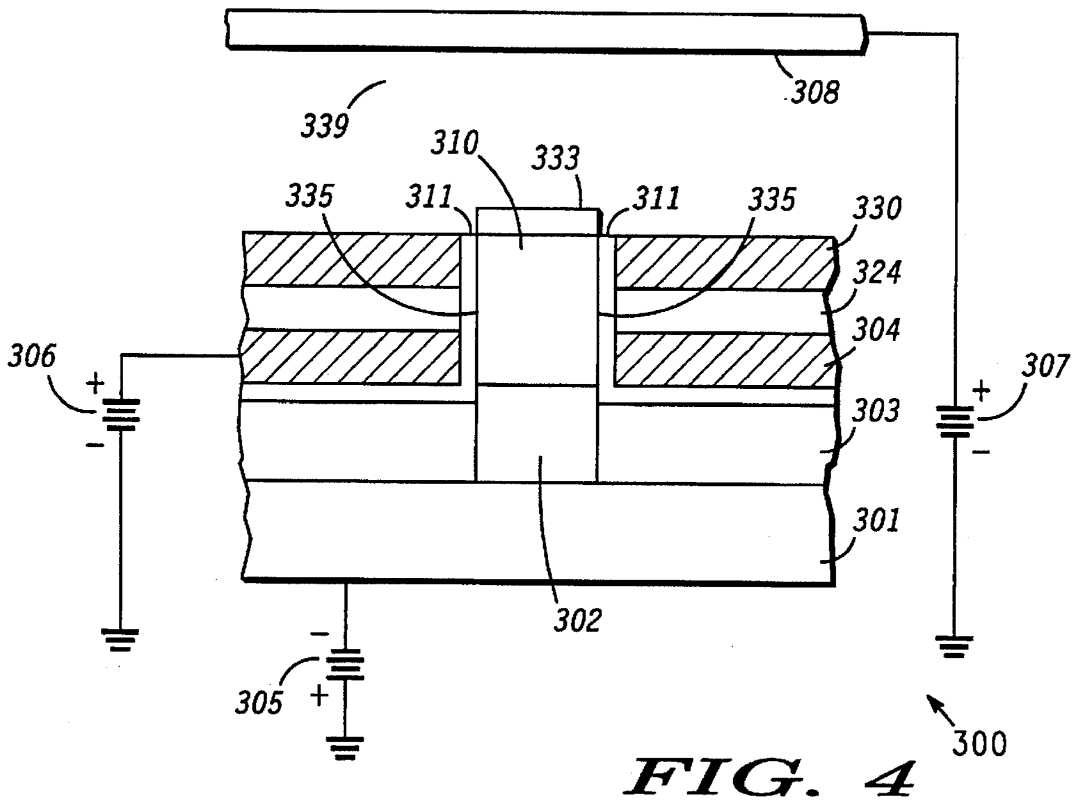
FIGS. 4–6 are cross-sectional views of yet another embodiment of a semiconductor diamond electron emission device made in accordance with the present invention.

FIG. 4 is a cross-sectional view illustrating yet another embodiment of an electron emission device 300 employing a selectively impurity doped semiconductor diamond electron emitter of the present invention wherein features similar to features previously described in FIGS. 1 and 2 are similarly designated beginning with the numeral "3". Additionally, FIG. 4 illustrates a second insulator 324 disposed on control electrode 304, and a second control electrode 330 disposed on second insulator 324. Second control electrode 330 is substantially peripherally disposed at least partially about a major surface 335 of an electron emitter 302 in a manner which provides for an insulating region 311, and a fourth externally provided voltage source 340 (shown in FIG. 5) operably coupled between second control electrode 330 and a reference potential. It is also illustrated, that a second externally provided voltage source 305 is operably connected between the supporting substrate and the reference potential as is sometimes appropriate for those embodiments wherein electron emitter 302 is operably coupled to a supporting substrate which includes materials that are either conductive, semiconductive, or a combination of both materials. For electron emitter 302 of electron emission device 300 of FIG. 4, it is illustrated that selectively impurity doped region 310 is disposed in electron emitter 302 at a location which is not at emitting surface 333. Such an impurity doping profile is commonly known in the semiconductor device art and may be realized by any of many commonly employed techniques, such as ion implantation of impurity dopants, or the like.

An insulative region 311 typically includes an insulative material that is deposited in a conformal manner. First insulator 303 is depicted as comprised of a plurality of insulator layers one of which includes material of the conformal layer of insulative region 311. Alternatively, as described previously, insulative region 311 may be a void of material and realized as a gap between electron emitter 302 and control electrodes 304 and 330.

Figure 5:
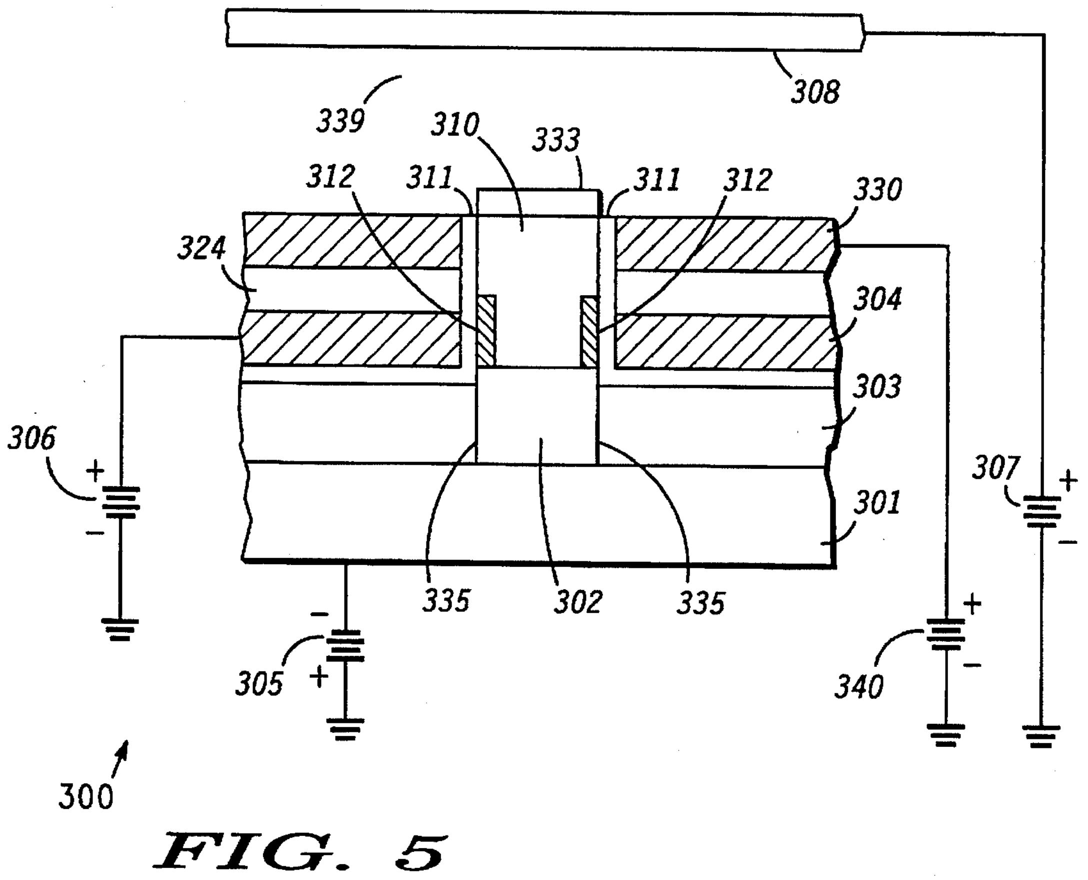

FIG. 5 is a cross-sectional view illustrating the inversion mode electron emission device 300 as described previously with reference to FIG. 4. An appropriate voltage is shown applied to first control electrode 304 by first externally provided voltage source 306 to induce an inversion region 312 in selectively impurity doped portion 310 of selectively impurity doped semiconductor diamond electron emitter 302. As is shown, inversion region 312 which is formed by application of the externally provided voltage to first control electrode 304 is insufficient to realize a conduction path extensive enough for electron transit to emitting surface 333.

Figure 6:
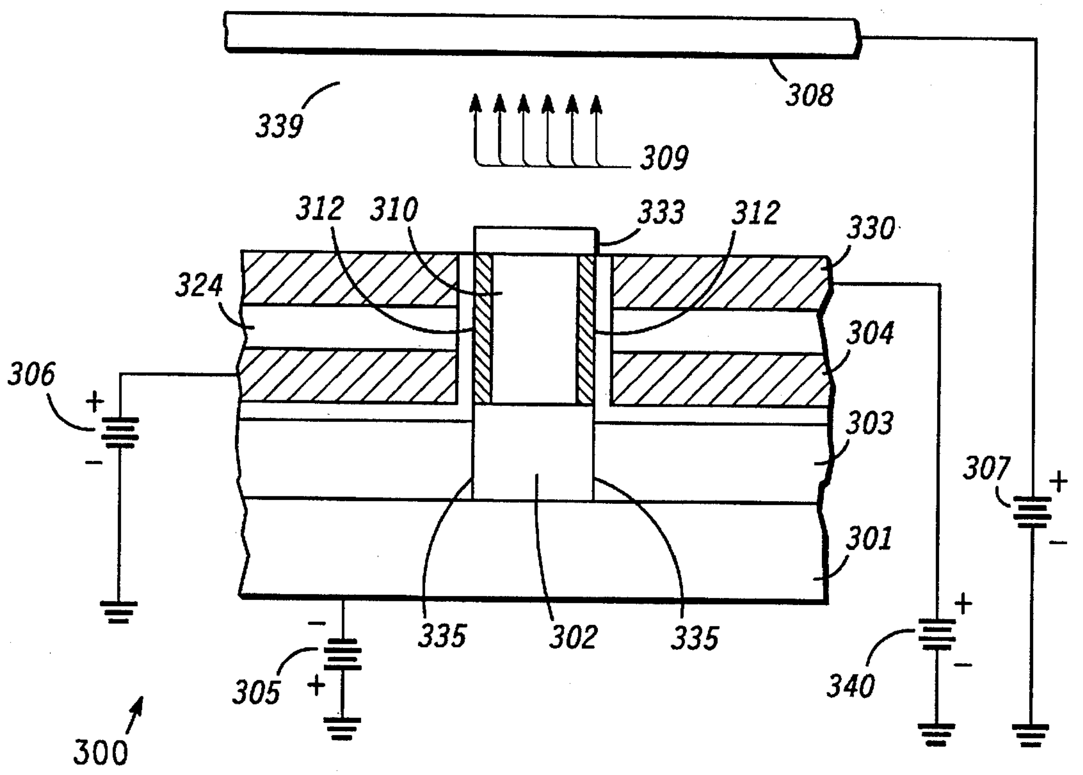

FIG. 6 is a cross-sectional view illustrating the inversion mode electron emission device 300 described previously with reference to FIG. 5 and having a voltage, provided by fourth external voltage source 340, applied to second control electrode 330. FIG. 6 further illustrates inversion region 312 extending a full breadth of selectively impurity doped region 310 to provide a conductive path through which electrons may readily pass to arrive at emitting surface 333. Electrons at emitting surface 333 are accelerated into free-space region 339 adjacent to emitting surface 333 by means of an induced electric field such as provided by applying a voltage to anode 308. Emitted electrons 309 traverse free-space region 339 to be collected at anode 308. Alternatively, in the absence of an anode or externally provided anode voltage, electrons arriving at emitting surface 333 of electron emitter 302 are accelerated into free-space region 339 by an electric field induced by the voltage applied to second control electrode 330 in which case emitted electrons 309 are substantially collected at second control electrode 330.

Figure 7:
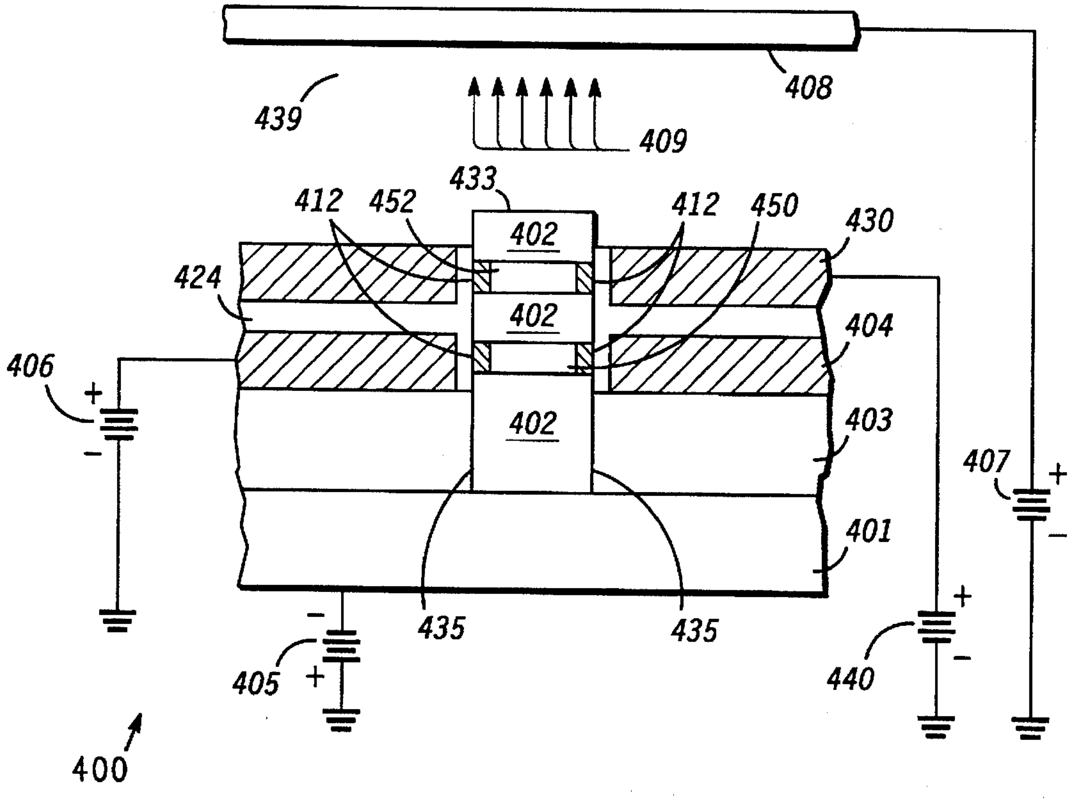
FIG. 7 is a cross-sectional view of still another embodiment of a semiconductor diamond electron emission device made in accordance with the present invention.

FIG. 7 is a cross-sectional view illustrating still another embodiment of an inversion mode electron emission device 400 employing a selectively impurity doped semiconductor diamond electron emitter as described previously with reference to FIG. 4–6, similar parts previously described are similarly designated beginning with the numeral "4". The selectively impurity doped region of the previous embodiment, which is designated 310, is realized in this embodiment as a first selectively impurity doped region 450 and a second selectively impurity doped region 452. As described previously, the selective impurity doping of regions of a semiconductor may be realized by any of many known methods, such as ion implantation or the like. An inversion region 412 is associated with each of the plurality of selectively impurity doped regions 450 and 452.

By now it should be appreciated that a novel inversion mode diamond electron source has been described. The inversion mode diamond electron source is made in such manner as to provide control of electron emission.

What is claimed is:

1. A method for making an inversion mode electron emitter device comprising the steps of:

A forming a selectively impurity doped diamond semiconductor electron emitter having an emitting surface, for emitting electrons, and a major surface; and B forming a control electrode and an insulator, the control electrode disposed substantially peripherally about a part of the major surface and the insulator disposed between the major surface and the control electrode, such that application of an externally provided voltage of proper magnitude and polarity between the control electrode and the selectively impurity doped diamond semiconductor electron emitter induces an electron conducting inversion layer in the electron emitter substantially at the part of the major surface.

2. A method for making an inversion mode electron emitter as claimed in claim 1 where, in the step of forming a selectively impurity doped diamond electron emitter, the selectively impurity doped diamond electron emitter is formed with a p-dopant.

3. A method for making an inversion mode electron emitter device comprising the steps of:

A forming a selectively impurity doped diamond semiconductor electron emitter having an emitting surface, for emitting electrons, and a major surface;

B disposing distally with respect to the emitting surface, an anode for collecting some of any emitted electrons; and C disposing a control electrode and an insulator, the control electrode disposed substantially peripherally about a part of the major surface in a manner and the insulator between the major surface and the control electrode such that application of an externally provided voltage of proper magnitude and polarity between the control electrode and the selectively impurity doped diamond semiconductor electron emitter induces an electron conducting inversion layer in the electron emitter substantially at a part of the major surface.

4. A method for making a inversion mode electron emitter device as claimed in claim 3 where, in the step of forming a selectively impurity doped diamond electron emitter, the selectively impurity doped diamond electron emitter is formed with a p-dopant.

5. A method for making an inversion mode electron emitter comprising the steps of:

A providing a supporting substrate having a surface;

B disposing a selectively impurity doped diamond semiconductor electron emitter on the surface of the supporting substrate, the electron emitter having an emitting surface for emitting electrons, and a major surface;

C disposing a first insulator on a part of the surface of the supporting substrate and on a part of the major surface; and D disposing a control electrode and a second insulator, the control electrode on a part of the first insulator substantially peripherally about a part of the major surface and the second insulator disposed between the major surface and the control electrode, such that application of an externally provided voltage of proper magnitude and polarity between the control electrode and the selectively impurity doped diamond semiconductor electron emitter induces an electron conducting inversion layer in the electron emitter substantially at a part of the major surface.

6. A method for making an inversion mode electron emitter comprising the steps of:

A providing a supporting substrate having a surface;

B disposing a selectively impurity doped diamond semiconductor electron emitter on the surface of the supporting substrate, the electron emitter having an emitting surface for emitting electrons, and a major surface;

C disposing a first insulator on a part of the surface of the supporting substrate and on a part of the major surface;

D disposing a second insulator on the first insulator layer and on another part of the major surface; and E disposing a control electrode and a third insulator, the control electrode being disposed on one of the first insulator and the second insulator substantially peripherally about a part of the major surface and the third insulator disposed between the major surface and the control electrode such that application of an externally provided voltage of proper magnitude and polarity between the control electrode and the selectively impurity doped diamond semiconductor electron emitter induces an electron conducting inversion layer in the electron emitter substantially at a part of the major surface.

7. A method for making an electron emitter as claimed in claim 6 where, in the step of disposing a first insulation on the part of the major surface, the first insulator is comprised of a plurality of insulator layers.

8. A method for making an inversion mode electron emitter as claimed in claim 6 where, in the step of disposing a selectively impurity doped diamond semiconductor electron emitter on the surface of the supporting substrate, the selectively impurity doped diamond semiconductor electron emitter is disposed such that the selectively impurity doped diamond semiconductor electron emitter is operably coupled to the supporting substrate.

9. A method for making an inversion mode electron emitter comprising the steps of:

A forming a selectively impurity doped diamond semiconductor electron emitter having an emitting surface, for emitting electrons, and a major surface;

B disposing a first control electrode and a first insulator, the first control electrode disposed substantially peripherally about a first part of the major surface in a manner which provides for the first insulator to be between the major surface and the first control electrode; and C disposing a second control electrode and a second insulator disposed substantially peripherally about a first part of the major surface in a manner which provides for the second insulator to be between the major surface and the second control electrode, such that application of an externally provided voltage of proper magnitude and polarity between the first control electrode and the selectively impurity doped diamond semiconductor electron emitter and between the second control electrode and the selectively impurity doped diamond semiconductor electron emitter induces an electron conducting inversion layer in the electron emitter substantially at a part of the major surface.

* * * * *